(12) United States Patent
Kim et al.

(10) Patent No.: US 7,364,940 B2
(45) Date of Patent: Apr. 29, 2008

(54) ORGANIC THIN FILM TRANSISTOR INCLUDING FLUORINE-BASED POLYMER THIN FILM AND METHOD OF FABRICATING THE SAME

(75) Inventors: Joo Young Kim, Suwon-si (KR); Eun Kyung Lee, Seoul (KR); Bang Lin Lee, Suwon-Si (KR); Bon Won Koo, Suwon-Si (KR); Hyun Jung Park, Seoul (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 308 days.

(21) Appl. No.: 11/296,704

(22) Filed: Dec. 8, 2005

(65) Prior Publication Data

US 2006/0151781 A1    Jul. 13, 2006

(30) Foreign Application Priority Data

Jan. 7, 2005    (KR) ...................... 10-2005-0001759

(51) Int. Cl.
*H01L 51/40* (2006.01)
(52) U.S. Cl. .................... 438/99; 257/40; 257/E51.006
(58) Field of Classification Search ............... 438/99; 257/40, E51.027, E51.006
See application file for complete search history.

(56) References Cited

U.S. PATENT DOCUMENTS

| | | | |
|---|---|---|---|
| 5,981,970 A | 11/1999 | Dimitrakopoulos et al. | |
| 6,232,157 B1 | 5/2001 | Dodabalapur et al. | |
| 6,558,987 B2 | 5/2003 | Lee | |
| 6,563,174 B2 | 5/2003 | Kawasaki et al. | |
| 7,202,495 B2* | 4/2007 | Unno ........................... | 257/40 |
| 7,282,735 B2* | 10/2007 | Wu et al. ..................... | 257/40 |
| 2004/0222412 A1* | 11/2004 | Bai et al. ...................... | 257/40 |
| 2005/0287697 A1* | 12/2005 | Unno et al. .................. | 438/99 |

OTHER PUBLICATIONS

Dimitrakopoulos, C.D., et al., Low-Voltage Organic Transistors on Plastic Comprising High-Dielectric Constant Gate Insulators, Feb. 5, 1999, vol. 283, Science, pp. 822-824.

\* cited by examiner

*Primary Examiner*—Trung Dang
(74) *Attorney, Agent, or Firm*—Harness, Dickey & Pierce, P.L.C.

(57) ABSTRACT

An organic thin film transistor including a fluorine-based polymer thin film and method of fabricating the same. The organic thin film transistor may include a gate electrode, a gate insulating layer, an organic semiconductor layer, source electrode, and a drain electrode formed on a substrate wherein a fluorine-based polymer thin film may be formed (or deposited) at the interface between the gate insulating layer and the organic semiconductor layer. The organic thin film transistor may have higher charge carrier mobility and/or higher on/off current ratio ($I_{on}/I_{off}$). In addition, a polymer organic semiconductor may be used to form the insulating layer and the organic semiconductor layer by wet processes, so the organic thin film transistor may be fabricated by simplified procedure(s) at reduced costs.

13 Claims, 3 Drawing Sheets

ORGANIC THIN FILM TRANSISTOR INCLUDING FLUORINE-BASED POLYMER THIN FILM AND METHOD OF FABRICATING THE SAME

PRIORITY STATEMENT

This application claims priority under 35 U.S.C. § 119 of Korean Patent Application No. 2005-1759, filed on Jan. 7, 2005, in the Korean Intellectual Property Office (KIPO), the entire contents of which are incorporated herein by reference.

BACKGROUND OF THE INVENTION

1. Field of the Invention

Example embodiments of the present invention relate to an organic thin film transistor (hereinafter also referred to as an "OTFT") including a fluorine-based polymer thin film. Various example embodiments of the present invention relate to an organic thin film transistor including a gate electrode, a gate insulating layer, an organic semiconductor layer, a source electrode, and/or a drain electrode formed on a substrate, wherein a fluorine-based polymer thin film may be formed at the interface between the gate insulating layer and the organic semiconductor layer.

2. Description of the Related Art

Various thin film transistors (TFTs) currently used in displays may include an amorphous silicon semiconductor, a silicon oxide insulating film and/or metal electrodes. With recent developments in various electrically conductive organic materials, research has focused on developing organic TFTs using organic semiconductors. Since the organic thin film transistors (OTFTs) developed in the 1980's may have advantages in terms of superior flexibility and/or ease of processing and fabrication, they are now under investigation for application to display devices, for example, E-ink devices, organic electroluminescence devices and liquid crystal displays (LCDs). Organic semiconductors may also be used in a wide variety of applications, e.g., functional electronic and optical devices, on account of their various synthetic processes, ease of molding into fibers and films, superior flexibility, and/or low fabrication costs. When compared to silicon transistors using amorphous Si, OTFTs using an organic semiconductor layer made of conductive organic molecules may have some advantages. For example, a semiconductor layer may be formed by printing processes at ambient pressure instead of conventional chemical vapor deposition (CVD) processes, such as plasma-enhanced chemical vapor deposition (CVD), and optionally, the overall fabrication procedure may be accomplished by roll-to-roll processes using plastic substrates.

Despite these advantages, OTFTs may encounter problems including low charge carrier mobility, high driving voltage and/or high threshold voltage, when compared to amorphous silicon TFTs. Charge carrier mobility of 0.6 $cm^2 \cdot V^{-1} \cdot sec^{-1}$ has recently been achieved in pentacene-based OTFTs, potentially increasing the use of OTFTs in certain applications. However, the mobility still may be unacceptable for practical TFT applications. In addition, drawbacks of pentacene-based TFTs may be a high driving voltage ($\geqq 100V$) and/or a high sub-threshold voltage 50 times than that of amorphous silicon TFTs.

On the other hand, other conventional art discloses organic thin film transistors with reduced driving voltage and/or threshold voltage using high dielectric constant ($\kappa$) insulating films. According to this conventional art, the gate insulting films may be composed of inorganic metal oxides, for example, $Ba_xSr_{1-x}TiO_3$ (barium strontium titanate (BST)), $Ta_2O_5$, $Y_2O_3$, $TiO_2$, etc., and ferroelectric insulators, for example, $PbZrxTi_{1-x}O_3$ (PZT), $B_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, $Bi_4Ti_3O_{12}$, etc. In addition, the gate insulting films may be formed by chemical vapor deposition, physical vapor deposition, sputtering, and/or sol-gel coating, and may have a dielectric constant above 15. The lowest driving voltage of the OTFTs may be reduced to −5V, but the highest charge carrier mobility still may be unsatisfactorily at 0.06 $cm^2 \cdot V^{-1} \cdot sec^{-1}$. Furthermore, because most of the fabrication may require a high temperature of 200-400° C., the range of applicable substrates may be limited and common wet processes, for example, simple coating and printing, may not be easily applied to fabricate such devices.

Other conventional art suggests the use of polyimide, benzocyclobutene, photoacryls and the like as materials for organic insulating films. However, because these organic insulating films may exhibit unsatisfactory device characteristics over inorganic insulating films, they may be unsuitable to replace inorganic insulating films.

Attempts have been made to use double-layer or multi-layer gate insulating layers in order to improve the performance of thin film electronic devices, for example, a multilayer gate insulating layer including two insulating layers made of silicon nitride and silicon oxide, and a double-layer insulating film including two insulating films made of the same material, which may improve the electrical insulating properties and/or the crystalline quality of semiconductor layers. However, because both gate insulating films were developed only for amorphous silicon- and single crystal silicon-based inorganic TFTs and use inorganic materials, they are not suitable for use in the fabrication of organic semiconductors.

As the application of OTFTs has recently been extended not only to LCD displays, but also to driving devices for flexible displays using an organic EL, the OTFTs may be required to have a high charge carrier mobility above 5 $cm^2 \cdot V^{-1} \cdot sec^{-1}$, a low driving voltage, and/or a low threshold voltage. Further, insulating films used in OTFTs may require superior insulating properties. Particularly, for simplified fabrication procedures and/or reduced fabrication costs, it may be desirable to fabricate OTFTs on plastic substrates by all-printing and/or all-spin on processes. Under these circumstances, although many studies have been devoted to forming organic gate insulating layers in a simple manner and increasing the charge carrier mobility at the interface between organic semiconductor layers and organic gate insulating layers, satisfactory results have not be achieved.

SUMMARY

According to an example embodiment of the present invention, when a fluorine-based polymer thin film may be formed at the interface between a gate insulating layer and an organic semiconductor layer (of an OTFT using a polymer semiconductor that can be fabricated by wet processes,) an OTFT having improved charge carrier mobility and/or on/off current ratio ($I_{on}/I_{off}$ ratio) may be formed.

Example embodiments of the present invention are directed to an OTFT method for fabricating an OTFT, having higher charge carrier mobility, improved electrical insulating properties, lower driving voltage and/or lower threshold voltage, including an insulating film formed by conventional wet processes.

In accordance with an example embodiment of the present invention, there is provided an organic thin film transistor (OTFT) including a gate electrode, a gate insulating layer, an organic semiconductor layer, a source electrode, and/or a drain electrode formed on a substrate, wherein a fluorine-based polymer thin film is formed at the interface between the gate insulating layer and the organic semiconductor layer.

In accordance with an example embodiment of the present invention, there is provided a method for fabricating an organic thin film transistor (OTFT) including a gate electrode, a gate insulating layer, an organic semiconductor layer, a source electrode, and/or a drain electrode formed on a substrate, wherein the method comprises forming a fluorine-based polymer thin film between the gate insulating layer and the organic semiconductor layer.

Example embodiments of the present invention are directed to OTFTs and methods for fabricating OTFTs with higher charge carrier mobility, lower driving voltages, lower threshold voltages, improved electrical insulating properties, and/or higher on/off current ratio ($I_{on}/I_{off}$).

BRIEF DESCRIPTION OF THE DRAWINGS

Example embodiments of the present invention will be more clearly understood from the following detailed description taken in conjunction with the accompanying drawings.

FIG. 1 is a cross-sectional view schematically showing the structure of a top-contact organic thin film transistor according to an example embodiment of the present invention;

FIG. 2 is a cross-sectional view schematically showing the structure of a bottom-contact organic thin film transistor according to another example embodiment of the present invention;

FIG. 3 is a cross-sectional view schematically showing the structure of a top-gate organic thin film transistor according to another example embodiment of the present invention;

FIG. 4 is a graph showing the current transfer characteristics of organic thin film transistors fabricated in accordance with an example embodiment of the present invention and Comparative Example 1; and FIG. 5 is a graph showing the current transfer characteristics of organic thin film transistors fabricated in accordance with an example embodiment of the present invention and Comparative Example 1.

DESCRIPTION OF EXAMPLE EMBODIMENTS OF THE PRESENT INVENTION

Figure 1:
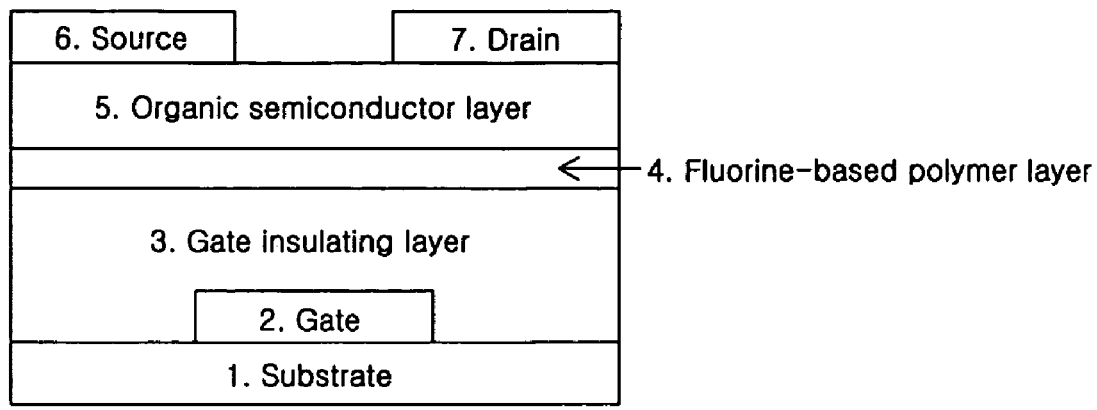
FIGS. 1-5 represent non-limiting examples, embodiments and/or intermediates of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

According to an example embodiment of the present invention, an organic thin film transistor may include a substrate, a gate electrode formed on the substrate, an insulating layer formed thereon, a fluorine-based polymer thin film formed on the insulating layer, a polymer semiconductor acting as an organic semiconductor layer formed on the fluorine-based polymer thin film, a source electrode, and/or a drain electrode formed on the organic semiconductor layer.

Figure 2:
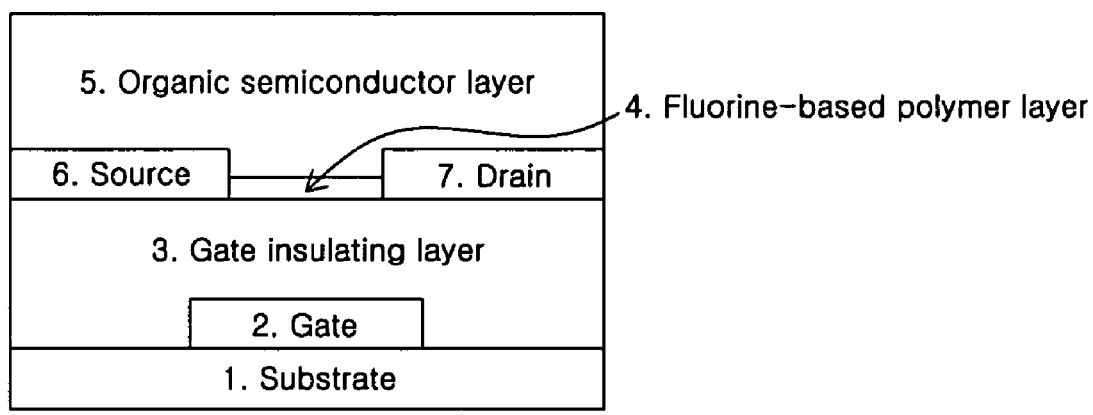
Figure 3:
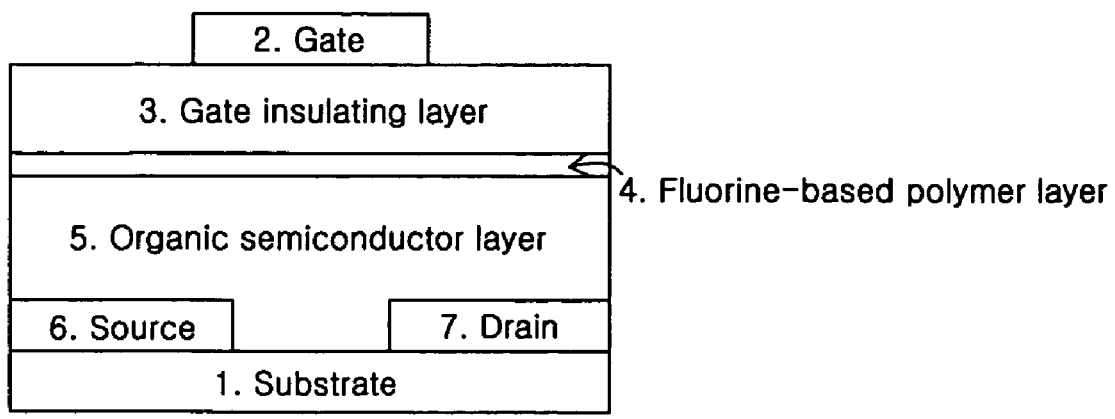

Example embodiments of FIGS. 1 to 3 of the present invention are cross-sectional views schematically showing the structure of organic thin film transistors. Specifically, the example embodiments of FIGS. 1 to 3 of the present invention show a top-contact device, a bottom-contact device, and a top-gate device, respectively. The structure of these devices may be variously modified and altered within the scope and spirit of the present invention. Referring to the example embodiment of FIG. 1 of the present invention, reference numeral 1 designates a substrate, reference numeral 2 designates a gate, reference numeral 3 designates a gate insulating layer, reference numeral 4 designates a fluorine-based polymer thin film, reference numeral 5 designates an organic semiconductor layer (e.g. an organic polymer layer), and reference numerals 6 and 7 designate a source electrode and a drain electrode, respectively.

The substrate 1 of the OTFT, according to an example embodiment of the present invention, may be made of materials including, but not limited to, glass, silicon, plastic, etc.

According to an example embodiment of the present invention, suitable materials for the gate electrode 2, the source electrode 6 and/or the drain electrode 7, may be made of metals and electrically conductive polymers commonly used in the art. Examples of such materials include, but are not limited to, gold (Au), silver (Ag), aluminum (Al), nickel (Ni), molybdenum (Mo), tungsten (W), indium-tin oxide (ITO), polythiophenes, polyanilines, polyacetylenes, polypyrroles, polyphenylene vinylenes, and polyethylenedioxythiophene (PEDOT)/polystyrenesulfonate (PSS) mixtures.

Examples of suitable materials for the gate insulating layer 3 of the organic thin film transistor, according to an example embodiment of the present invention, include, but are not limited to, common organic compounds, such as polyvinylphenols, polymethylmethacrylates, polyacrylates and polyvinyl alcohols, and common inorganic materials, such as $SiN_x$ (0<x<4), $SiO_2$ and $Al_2O_3$. For example, a polyvinylphenyl-based copolymer and a crosslinking agent, and/or an organic-inorganic hybrid insulator (see U.S. patent application Ser. Nos. 10/864,469 and 10/807,271, respectively, the entire contents of which are hereby incorporated by reference) may be used as a suitable material for the gate including layer 3 according to an example embodiment of the present invention.

Pursuant to an example embodiment of the present invention, the gate insulating layer 3 may be formed by common wet processes, including, but not limited to, dip coating, spin coating, printing, spray coating, and roll coating.

If needed, the thickness of the gate insulating layer 3 may be appropriately controlled according to an example embodiment of the present invention. For example, the thickness of the gate insulating layer may be in a range from about 3,000 Å to about 7,000 Å (e.g., 3,250 Å, 3,500 Å, 3,750 Å, 4,000 Å, 4,250 Å, 4,500 Å, 5,000 Å, 5,250 Å, 5,500 Å, 5,750 Å, 6,000 Å, 6,250 Å, 6,500 Å, and 6,750 Å).

Suitable materials for the fluorine-based polymer thin film 4 (formed at the interface between the organic semiconductor layer 5 and the gate insulating layer 3) may include, but are not limited to, polymers in which the ratio of the number of carbon atoms to the number of fluorine atoms present in the backbone or side chains is in a range from about 5:1 to about 30:1 (e.g., 6:1, 7:1, 8:1, 9:1, 10:1, 12:1, 14:1, 16:1, 18:1, 20:1, 22:1, 24:1, 26:1, and 28:1).

Examples of polymers suitable for the fluorine based polymers may contain at least one repeating unit selected from the group consisting of a repeating unit represented by Formula 1 and/or repeating units represented by Formula 2 below:

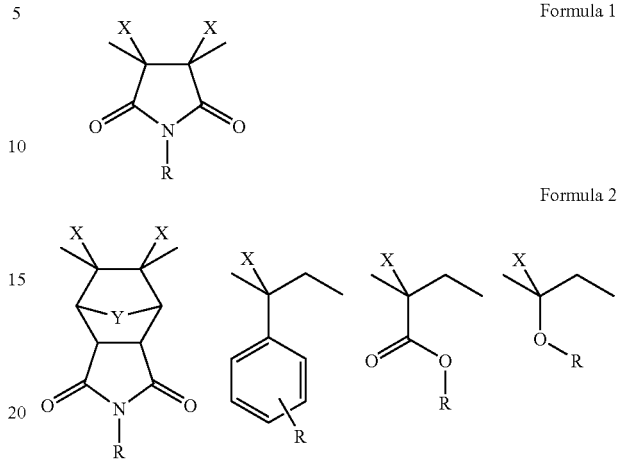

wherein X is a hydrogen atom, a $C_{1\sim14}$ linear or branched alkyl group, a fluorine atom, or a chlorine atom, Y is an oxygen atom or a $C_{2\sim14}$ alkylene group, and R is the group represented by Formula 3 below:

$$-\!\!-\!\!(\!-\!R_1\!-\!)_{\overline{k}}\!(\!-\!R_2\!-\!)_{\overline{l}}\!(\!-\!R_3\!)\qquad \text{Formula 3}$$

wherein $R_1$ is selected from the group consisting of functional groups represented by Formula 4 below:

(where n is an integer from 0 to about 10), $R_2$ is independently any one of the functional groups represented by Formulae 5 below:

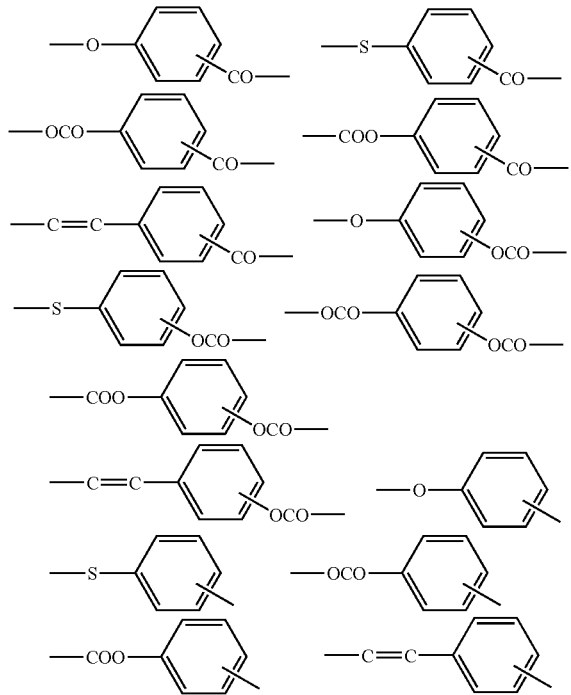

Formula 5

$R_3$ is independently any one of functional groups represented by Formulae 6 below:

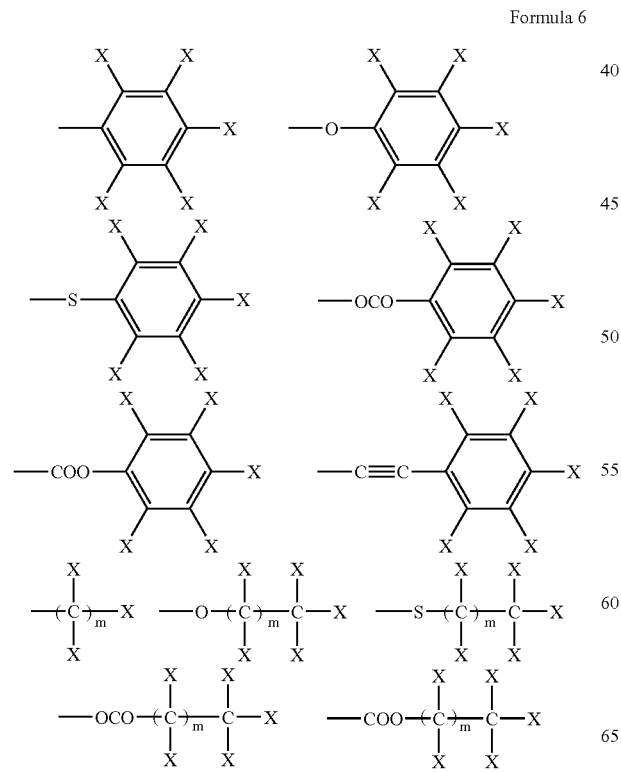

Formula 6

(wherein X contains at least one fluorine atom, and X is H, F, $CF_3$, $CHF_2$, $CH_2F$, $OCF_3$, $OCHF_2$ or $OCH_2F$, and m is an integer from 0 to about 18, for example, 2, 4, 6, 8, 10, 12, 14 and 16), k is an integer between 1 and 3, provided that when k is 2 or greater, each $R_1$ may be the same or different, and l is an integer between 0 and 5, provided that when l is 2 or greater, each $R_2$ may be the same or different.

According to an example embodiment of the present invention, the polymers may be characterized in that the ratio of the number of carbon atoms to the number of fluorine atoms present in the backbone or side chains of the polymers may be in a range from about 5:1 to about 30:1.

According to an example embodiment of the present invention, for improved electrical properties of the insulating layer, fluorine atoms may be introduced into the backbone or side chains of the fluorine-based polymer to adjust the ratio of the number of fluorine atoms to the number of carbon atoms as noted above.

Pursuant to an example embodiment of the present invention, the layer of the fluorine-based polymer between the gate insulating layer and the organic active layer may result in an improvement in charge carrier mobility and/or on/off current ratio ($I_{on}/I_{off}$).

Specific examples of the fluorine-based polymers that may be used are compounds including, but not limited to, those represented by Formulae 7 and 8 below:

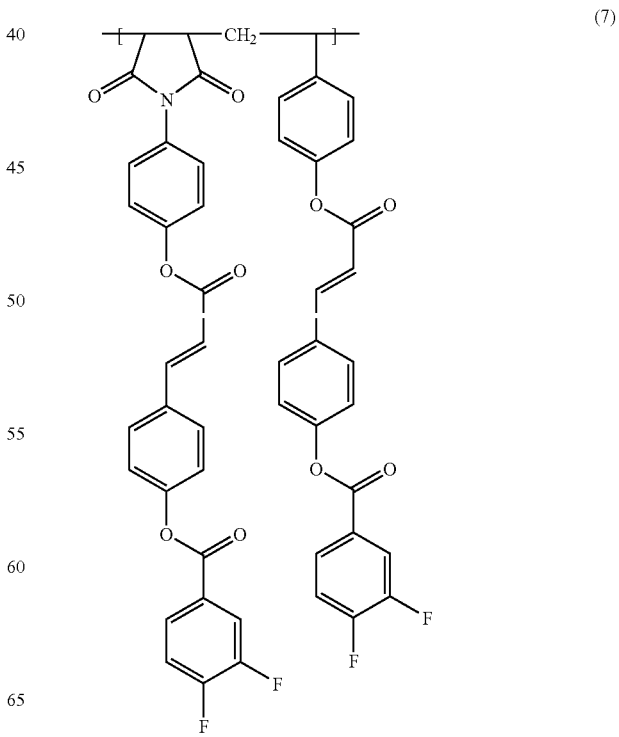

(7)

-continued (8)

[structure showing repeating units with CH₂ backbone, maleimide group with N-phenyl-O-(CH₂)ₙ-O-trifluorophenyl substituent, and phenyl-O-(CH₂)ₙ-O-trifluorophenyl substituent]

wherein (7) and (8) represent repeating units. Other suitable materials may be used.

According to an example embodiment of the present invention, the fluorine-based polymer thin film 4 may be formed or deposited (e.g., 120 Å, 140 Å, 160 Å, 180 Å, 200 Å, 220 Å, 240 Å, 260 Å, and 280 Å) by any conventional wet coating process, and may be formed or deposited to a thickness from about 100 Å to 300 Å by spin coating.

Pursuant to an example embodiment of the present invention, the fluorine-based polymer thin film 4 may be deposited by common wet processes, including, but not limited to, spin coating, dip coating, printing, ink-jet coating, and roll coating. Other suitable processes may be used.

The performance of the organic thin film transistor comprising the fluorine-based polymer thin film according to example embodiments of the present invention may be superior to that of conventional OTFTs using common polymer semiconductors because example embodiment organic thin film transistors of the present invention have higher charge carrier mobility and/or on/off current ratio ($I_{on}/I_{off}$) than do conventional OTFTs. Furthermore, the gate insulating layer, the fluorine-based polymer thin film and/or the organic semiconductor layer of the organic thin film transistor (according to example embodiments of the present invention) may be formed by a common wet process, e.g., printing or spin coating, while at the same time, the electronic performance of the organic thin film transistor may be comparable to that of Si TFTs that may be fabricated through more complicated processes.

The organic semiconductor layer 5 of the organic thin film transistor (according to an example embodiment of the present invention) may be formed using all known polymer materials, including (but not limited to) polythiophene derivatives, that may be coated by wet processes. Examples of suitable materials for the organic semiconductor layer 5 in connection with example embodiments of the present invention include (but are not limited to) polythiophenes, polyanilines, polyacetylenes, polypyrroles, polyphenylene vinylenes, and derivatives thereof. The organic semiconductor material may be formed/deposited by screen printing, printing, spin coating, dip coating, and ink jet(ting), for example. Other methods for forming/depositing the organic semiconductor material may be used.

There is no particular restriction as to the structure of the organic thin film transistor, but examples thereof include, top-contact, bottom-contact, and top-gate structures. Other OTFT structures may be made according to example embodiments of the present invention.

An OTFT (according to an example embodiment of the present invention) may be fabricated by forming a gate electrode on a substrate, forming a gate insulating layer thereon by a wet process (or other suitable process), e.g., spin coating, printing, or the like, forming a fluorine-based polymer thin film on the gate insulating layer by a wet process (or other suitable process), forming an organic semiconductor layer on the fluorine-based polymer thin film, and forming source and drain electrodes on the organic semiconductor layer.

Examples of organic thin film transistors that may be fabricated by a method of the present invention (according to example embodiments thereof) include top-contact organic thin film transistors, bottom-contact organic thin film transistors and top-gate organic thin film transistors. Other OTFT structures may be made according to example embodiments of the present invention.

Specifically, according to an example embodiment of the present invention, top-contact organic thin film transistors may be fabricated by a method including forming a gate electrode on a substrate, forming a gate insulating layer thereon, forming a fluorine-based polymer thin film on the gate insulating layer, forming an organic semiconductor layer (e.g., using a polymer semiconductor) on the fluorine-based polymer thin film, and forming source and drain electrodes on the organic semiconductor layer. Other suitable materials may be used.

According to another example embodiment of the present invention, bottom-contact organic thin film transistors may be fabricated by a method including forming a gate electrode on a substrate, forming a gate insulating layer thereon, forming a fluorine-based polymer thin film on the gate insulating layer, forming source and drain electrodes on (or adjacent to) the fluorine-based polymer thin film, and forming an organic semiconductor layer (e.g., using a polymer semiconductor) thereon. Other suitable materials may be used.

According to yet another example embodiment of the present invention, top-gate organic thin film transistors may be fabricated by a method including forming source and drain electrodes on a substrate, forming an organic semiconductor layer (e.g., using a polymer semiconductor) between and/or on the source electrode and the drain electrode, forming a fluorine-based polymer thin film on the organic semiconductor layer, forming an insulating layer on the fluorine-based polymer thin film, and forming a gate electrode on the insulating layer. Other suitable materials may be used.

Example embodiment of the present invention will be described in more detail with reference to the following specific examples. However, these examples are given for the purpose of illustration and are not to be construed as limiting the spirit and/or scope of the present invention.

Preparation of Composition for Formation of Fluorine-based Polymer Thin Film (1) Synthesis of 3,4-difluoro-benzoic acid 4-(2-chlorocarbonyl-vinyl)-phenyl ester 10 g of 3,4-difluoro-benzoic acid 4-(2-chloro)carbonyl-vinyl)-phenyl ester (21.68 mmol) was dissolved in 200 ml of methylene chloride, and then 2.84 g (23.848 mmol) of thionyl chloride (SOCl$_2$) was added thereto. After the reaction mixture was stirred at 35° C. for 6 hours, the solvent was removed. Drying in vacuo gave the desired compound 1 (yield: 90%).

(2) Synthesis of Maleimide-styrene Copolymer Derivative 2.74 g (9.033 mmol) of polyhydroxymaleimide-polyhydroxystyrene was dissolved in 50 ml of N-methylpyrrolidone (NMP). After the solution was cooled to 0° C., 3.291 g (32.52 mmol) of triethylamine (Et$_3$N) was added thereto. The mixture was stirred for 30 minutes. 6.995 g (21.679 mmol) of 3,4-difluoro-benzoic acid 4-(2-chlorocarbonyl-vinyl)-phenyl ester was added to the mixture and stirred at room temperature for 4 hours. The reaction solution was poured into an aqueous solution of methanol, and filtered to obtain a solid. The solid was washed with water several times and dried in vacuo, affording the desired compound 2 (yield: 60%).

This reaction procedure is depicted in Reaction Scheme 1 below:

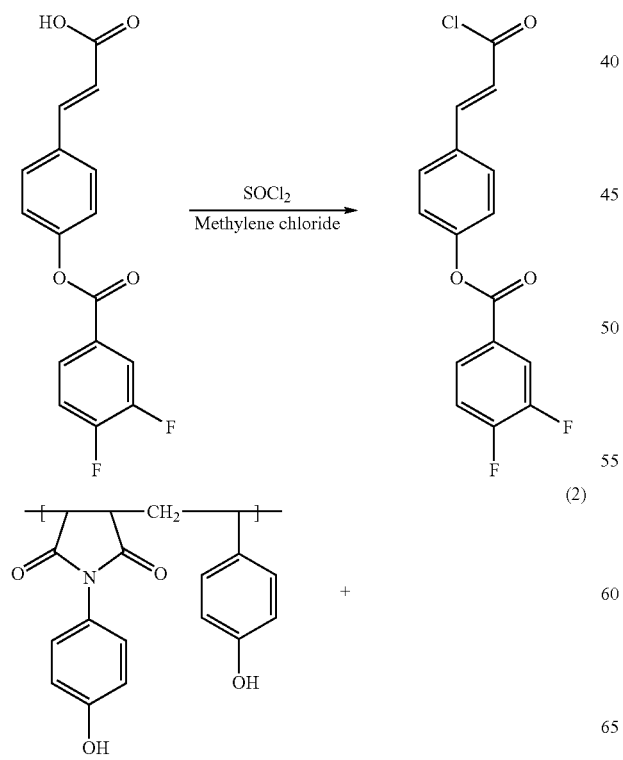

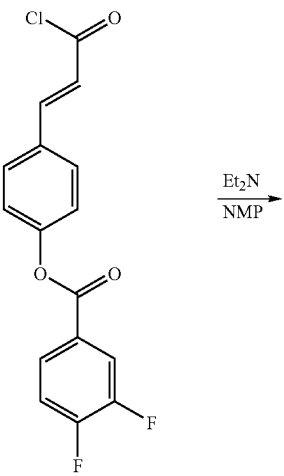

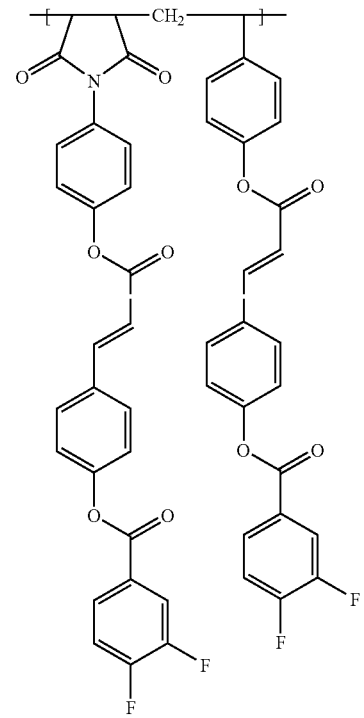

Preparation of Composition for Formation of Another Fluorine-based Polymer Thin Film (1) Synthesis of 4-[6-(3,4,5-trifluoro-phenoxy)-hexyloxy]-benzoic acid 2.75 g of 4-[6-(3,4,5-Trifluoro-phenoxy)-hexyloxy]-benzoic acid ethyl ester was dissolved in 100 ml of 1,4-dioxane, and then 100 ml of a 1.0M NaOH solution was added thereto. After stirring for one day, the reaction solution was acidified with a 10% HCl solution and filtered to obtain a solid. The solid was recrystallized from ethanol to afford 4-[6-(3,4,5-trifluoro-phenoxy)-hexyloxy]-benzoic acid (yield: 62%).

(2) Synthesis of 4-[6-(3,4,5trifluoro-phenoxy)-hexyloxy]-benzoyl chloride 10 g (27.148 mmol) of 4-[6-(3,4,5-trifluoro-phenoxy)-hexyloxy]-benzoic acid was dissolved in 200 ml of methylene chloride, and then 3.55 g (29.862 mmol) of thionyl chloride was added thereto. The reaction mixture was stirred at 35° C. for 6 hours, and then the solvent was removed. Drying in vacuo gave the desired compound 1 (yield: 95%).

(3) Synthesis of Maleimide-styrene Copolymer Derivative 2.74 g (9.033 mmol) of polyhydroxymaleimide-polyhydroxystyrene was dissolved in 50 ml of N-methylpyrrolidone (NMP). After the solution was cooled to 0° C., 3.291 g (32.52 mmol) of triethylamine was added thereto. The mixture was stirred for 30 minutes. 8.385 g (21.679 mmol) of 4-[6(3,4,5-trifluoro-phenoxy)-hexyloxy]-benzoyl chloride was added to the mixture and stirred at room temperature for 4 hours. The reaction solution was poured into an aqueous solution of methanol, and filtered to obtain a solid. The solid was washed with water several times and dried in vacuo, affording the desired compound 2 (yield: 71%).

This reaction procedure is depicted in Reaction Scheme 2 below:

Reaction Scheme 2

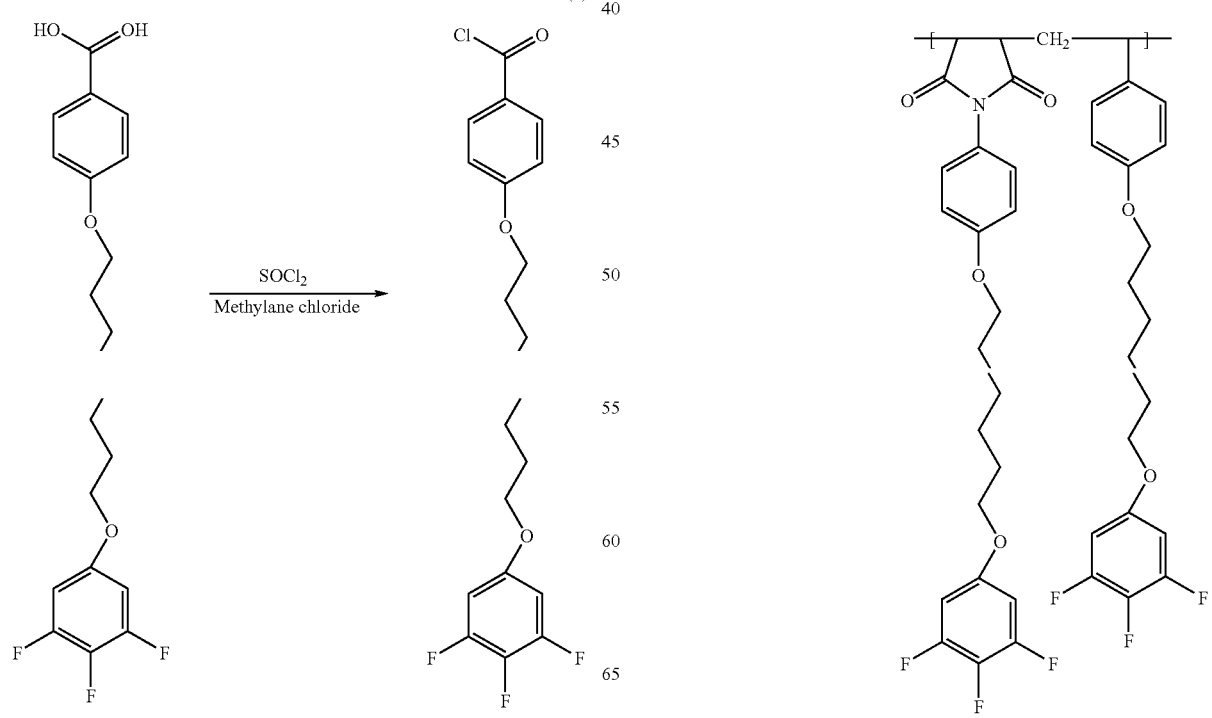

An organic insulator composition prepared by blending an acrylic crosslinking agent with a polyvinylphenyl copolymer was spin-coated on a glass substrate on which an aluminum gate electrode was formed to form a 7,000 Å thick insulating layer, and baked under a nitrogen atmosphere at 100° C. for one hour to form a 6,000 Å thick gate insulating layer. Thereafter, a solution of a 2 wt % of the composition prepared as set forth above in cyclohexanone was spin-coated at 3,000 rpm to a thickness of 300 Å on the gate insulating layer, and cured at 150° C. for 10 minutes to form a fluorine-based polymer thin film. A polythiophene derivative as a polymer semiconductor material was spin-coated to a thickness of 500 Å on the fluorine-based polymer thin film to form an organic semiconductor layer. The formation of the active layer was conducted under a nitrogen atmosphere. Au source and drain electrodes were formed on the active layer through a shadow mask (channel length: 100 μm, channel width: 1 mm) in a top-contact manner to fabricate an organic thin film transistor (OTFT). The charge carrier mobility, threshold voltage and current ratio $I_{on}/I_{off}$ of the OTFT were measured, and the results are shown in Table 1 below.

The charge carrier mobility was calculated from the slope of a graph representing the relationship between $(ISD)^{1/2}$ and VG from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, ISD: source-drain current, μ and μFET: charge carrier mobility, Co: capacitance of the oxide film, W: channel width, L: channel length, VG: gate voltage, and VT: threshold voltage.

* The $I_{on}/I_{off}$ ratio was determined from a ratio of a maximum current in the on-state to a minimum current in the off-state. The $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

where $I_{on}$: maximum current, $I_{off}$: off-state leakage current, μ: charge carrier mobility, σ: conductivity of thin film, q: electric charge, $N_A$: electric charge density, t: thickness of semiconductor film, $C_0$: capacitance of insulating film, and $V_D$: drain voltage.

As can be seen from this equation, the larger the dielectric constant and the smaller the thickness of the dielectric film, the larger the $I_{on}/I_{off}$ ratio. Therefore, the kind and thickness of the dielectric film may be crucial factors in determining the $I_{on}/I_{off}$ ratio. The off-state leakage current $(I_{off})$ is a current flowing in the off-state, and was determined from the minimum current in the off-state.

Figure 4:
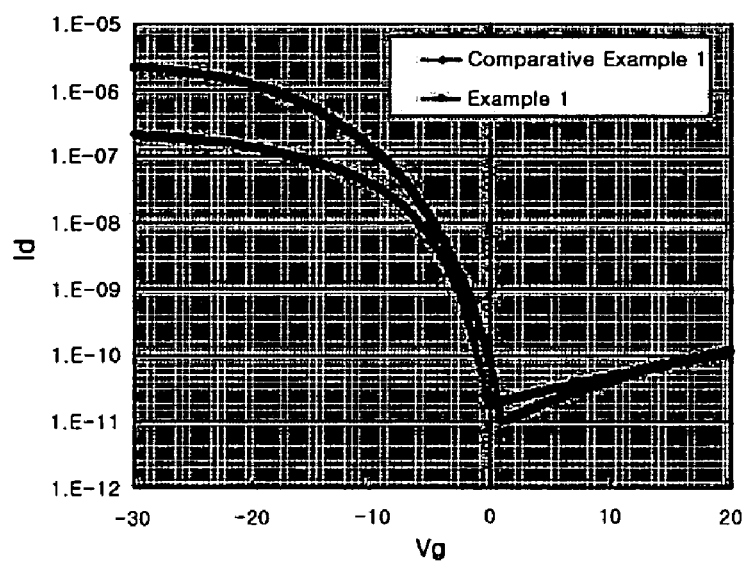

The current transfer characteristics of the organic thin film transistors obtained in an example embodiment and Comparative Example 1 are shown in FIG. 4. The graph shown in FIG. 4 represents changes in ISD versus VG with increasing effective dielectric constant.

An OTFT was fabricated in the same manner as above, except that another fluorine-based polymer compound was used. The charge carrier mobility, threshold voltage and current ratio $I_{on}/I_{off}$ of the OTFT were measured, and the results are shown in Table 1, below.

Figure 5:
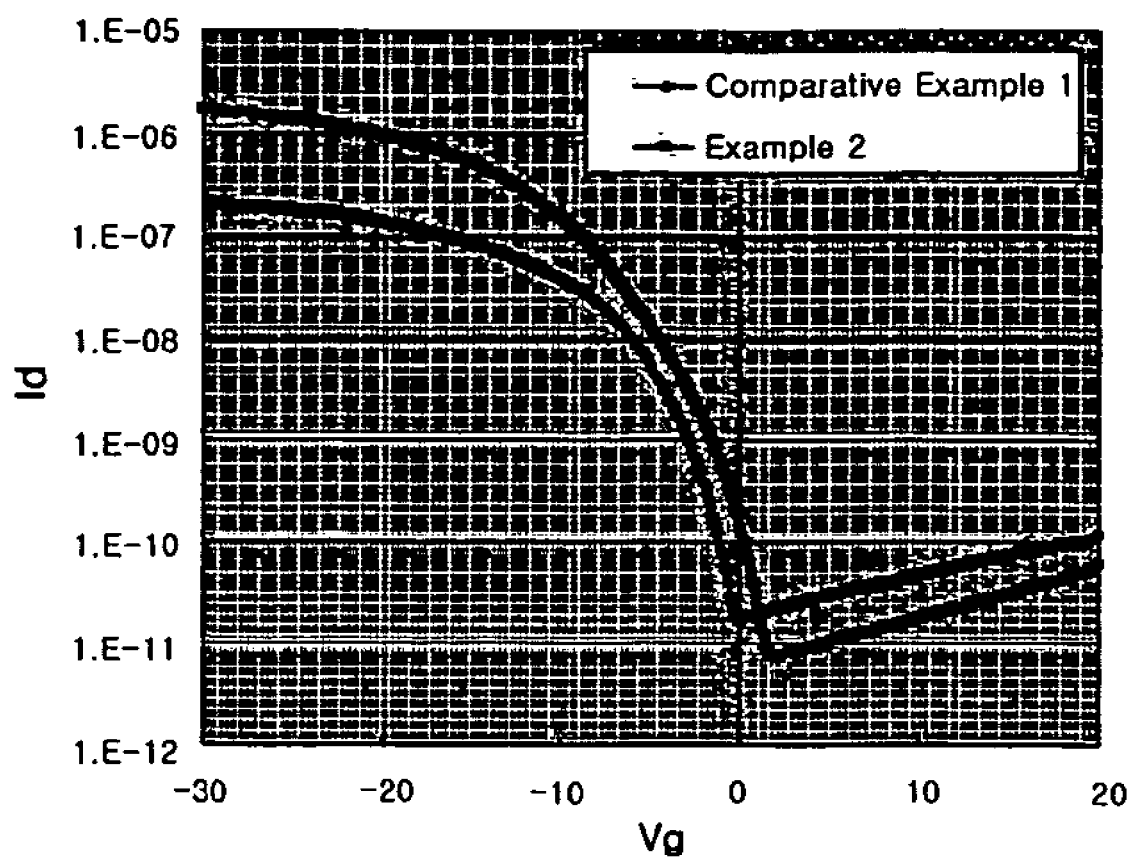

The current transfer characteristics of the organic thin film transistors obtained in an example embodiment and Comparative Example 1 are shown in FIG. 5. The graph shown in FIG. 5 represents changes in ISD versus VG with increasing effective dielectric constant.

For Comparative Example 1, an OTFT was fabricated in the same manner as in Example 1 without formation of any fluorine-based thin film. The charge carrier mobility, threshold voltage and current ratio $I_{on}/I_{off}$ of the OTFT were measured, and the results are shown in Table 1 below. FIGS. 4 and 5 show the current transfer characteristics of the organic thin film transistor, representing changes in ISD versus VG with increasing effective dielectric constant.

TABLE 1

| Example No. | Threshold voltage $(V_{TH})[V]$ | $I_{on}/I_{off}$ | Charge carrier mobility $(cm^2/Vs)$ |
|---|---|---|---|
| Example 1 | −6 | $2.7 \times 10^5$ | 0.25 |
| Example 2 | −4 | $2.3 \times 10^5$ | 0.17 |
| Comparative Example 1 | −2 | $1.3 \times 10^4$ | 0.024 |

As can be seen from the data shown in Table 1, example embodiments of the OTFTs of the present invention may have higher charge carrier mobility, lower driving voltage, lower threshold voltage, and/or higher $I_{on}/I_{off}$ ratio while exhibiting superior electrical insulating properties, and may be suitable as transistors for various electronic devices.

As apparent from the foregoing, the example embodiments of the present invention may have higher charge carrier mobility and/or higher $I_{on}/I_{off}$ ratio. In addition, because the organic semiconductor layer and the insulating layer of the organic thin film transistor according to example embodiments of the present invention may be easily formed by wet processes, the organic thin film transistor may be fabricated by simplified procedures at reduced costs.

Although the example embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic thin film transistor including a substrate, a gate electrode, a gate insulating layer, an organic semiconductor layer, a source electrode, and a drain electrode, the organic thin film transistor comprising:
   a fluorine-based polymer thin film formed between the gate insulating layer and the organic semiconductor layer, wherein
   the fluorine-based polymer thin film is formed of a polymer having a number ratio of carbon atoms to fluorine atoms from about 5:1 to about 30:1 and containing at least one repeating unit selected from the group consisting of repeating units represented by Formula 1 and repeating units represented by Formula 2 below:

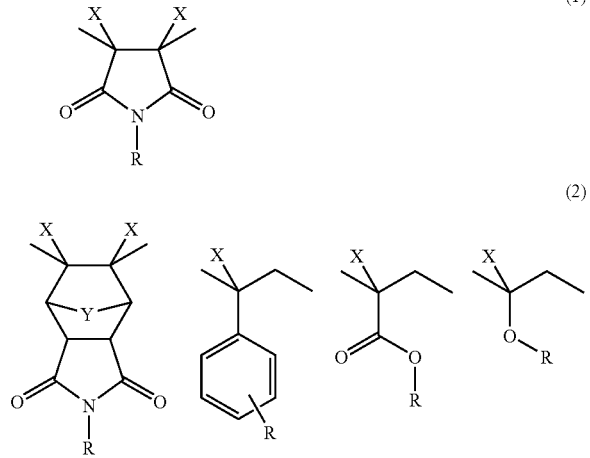
(1)
(2)

wherein X is a hydrogen atom, a $C_{1\sim14}$ linear or branched alkyl group, a fluorine atom, or a chlorine atom, Y is an oxygen atom or a $C_{2\sim14}$ alkylene group, and R is a group of represented by Formula 3 below:

(3)

wherein $R_1$ is independently any one of the functional groups represented by Formulae 4 below:

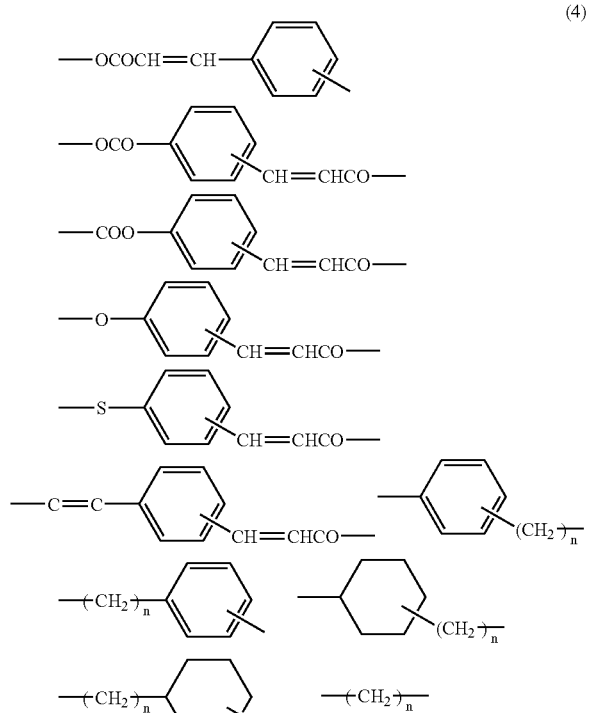
(4)

(where n is an integer from 0 to about 10), $R_2$ is independently any one of the functional groups represented by Formulae 5 below:

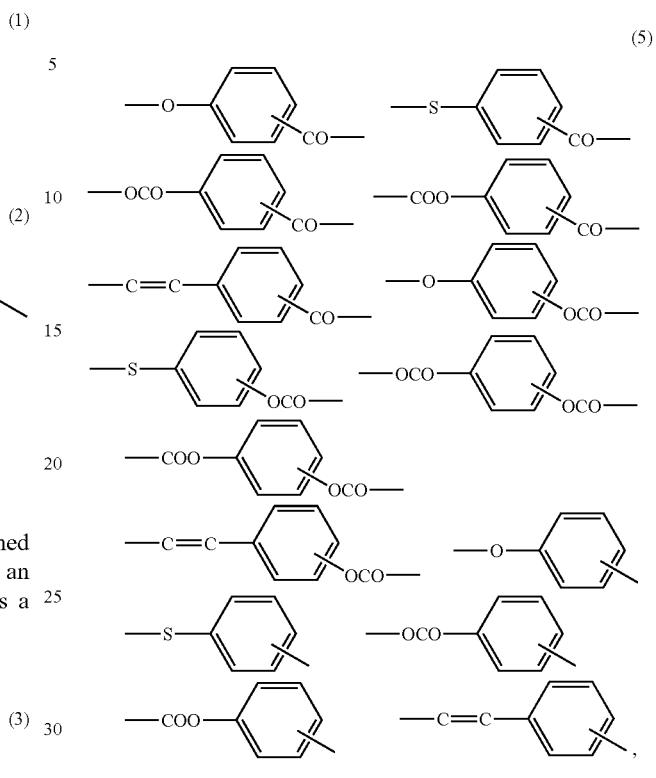
(5)

and $R_3$ is independently any one of the functional groups represented by Formulae 6 below:

(6)

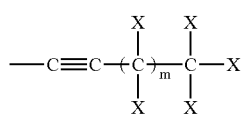

(where X contains at least one fluorine atom, and X is independently H, F, CF$_3$, CHF$_2$, CH$_2$F, OCF$_3$, OCHF$_2$ or OCH$_2$F, and m is an integer from 0 to about 18), k is an integer between 1 and 3, provided that when k is 2 or greater, each R$_1$ may be the same or different, and l is an integer between 0 and 5, provided that when l is 2 or greater, each R$_2$ may be the same or different.

2. The organic thin film transistor according to claim 1, wherein the fluorine-based polymer is a compound represented by Formula 7 or 8 below:

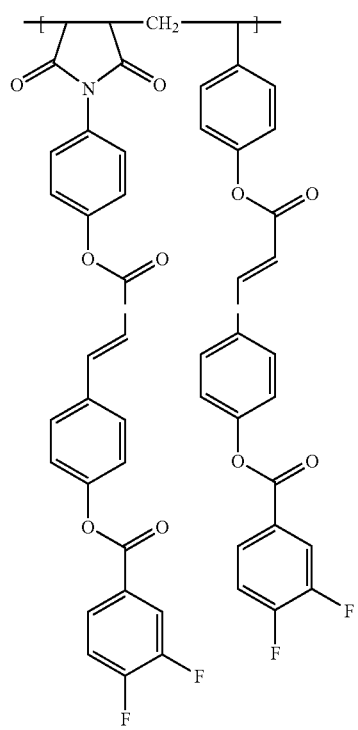

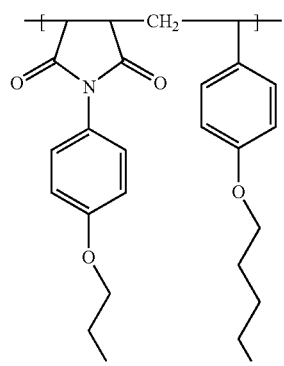

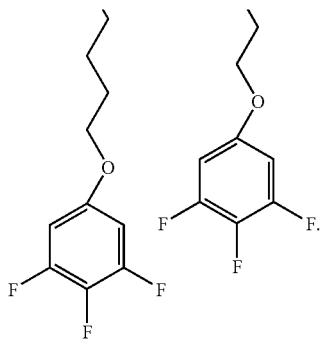

3. The organic thin film transistor according to claim 1, wherein the fluorine-based polymer thin film is formed or deposited by spin coating, dip coating, printing, ink-jet coating, or roll coating.

4. The organic thin film transistor according to claim 1, wherein the fluorine-based polymer thin film has a thickness from about 100 Å to about 300 Å.

5. The organic thin film transistor according to claim 1, wherein the gate insulating layer is made of a material selected from the group consisting of polyvinylphenols, polymethylmethacrylates, polyacrylates, polyvinyl alcohols, SiN$_x$ (0<x<4), SiO$_2$, Al$_2$O$_3$, and derivatives thereof.

6. The organic thin film transistor according to claim 1, wherein the organic semiconductor layer is formed of a polymer selected from the group consisting of polythiophenes, polyanilines, polyacetylenes, polypyrroles, polyphenylene vinylenes, and derivatives thereof.

7. The organic thin film transistor according to claim 1, wherein the gate electrode, the source electrode and the drain electrode are independently made of a material selected from the group consisting of gold (Au), silver (Ag), aluminum (Al), nickel (Ni), molybdenum (Mo), tungsten (W), indium-tin oxide (ITO), polythiophenes, polyanilines, polyacetylenes, polypyrroles, polyphenylene vinylenes, and polyethylenedioxythiophene (PEDOT)/polystyrenesulfonate (PSS) mixtures.

8. The organic thin film transistor according to claim 1, wherein the substrate is made of a material selected from the group consisting of glass, silicon, and plastic.

9. The organic thin film transistor according to claim 1, wherein the organic thin film transistor has a top-contact, bottom-contact, or top-gate configuration.

10. A method for fabricating an organic thin film transistor comprising:

forming a fluorine-based polymer thin film between a gate insulating layer and an organic semiconductor layer, wherein the fluorine-based polymer thin film is formed of a polymer having a number ratio of carbon atoms to fluorine atoms from about 5:1 to about 30:1 and containing at least one repeating unit selected from the group consisting of repeating units represented by Formula 1 and repeating units represented by Formula 2 below:

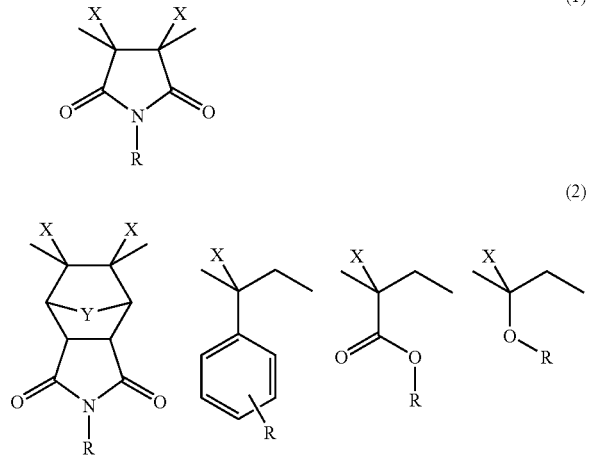

(1)

(2)

wherein X is a hydrogen atom, a $C_{1\sim14}$ linear or branched alkyl group, a fluorine atom, or a chlorine atom, Y is an oxygen atom or a $C_{2\sim14}$ alkylene group, and R is a group of represented by Formula 3 below:

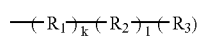

(3)

wherein $R_1$ is independently any one of the functional groups represented by Formulae 4 below:

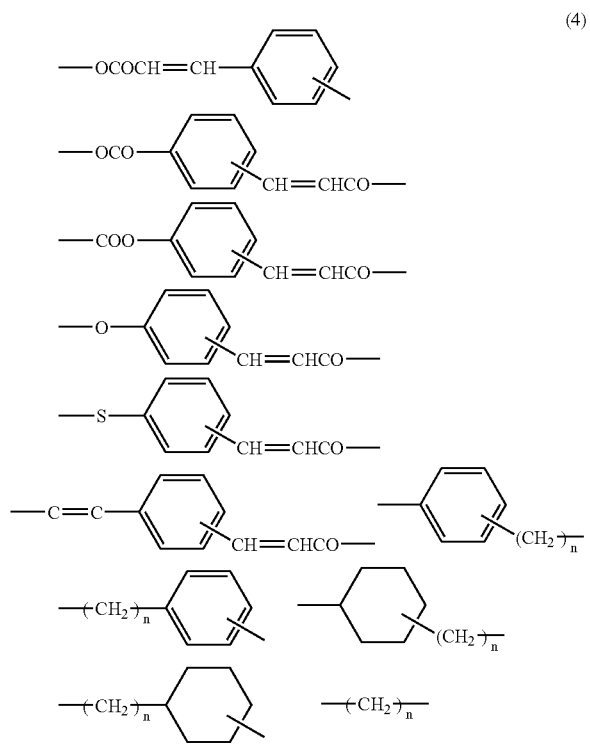

(4)

(where n is an integer from 0 to about 10), $R_2$ is independently any one of the functional groups represented by Formulae 5 below:

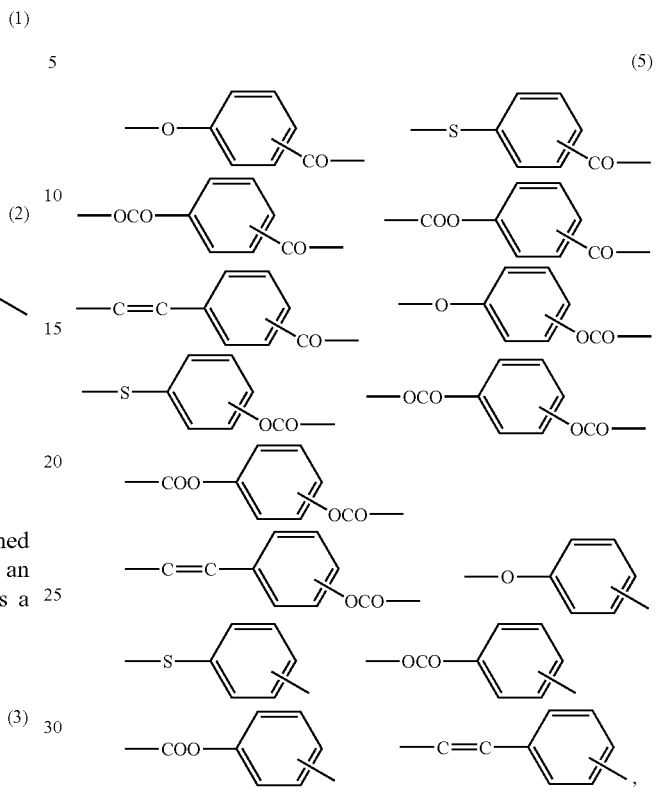

(5)

$R_3$ is independently any one of the functional groups represented by Formulae 6 below:

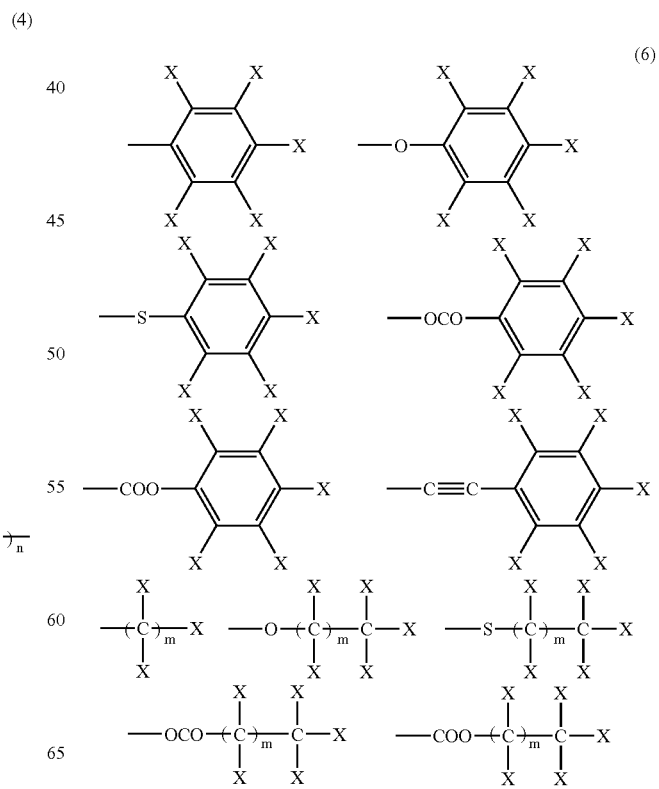

(6)

-continued

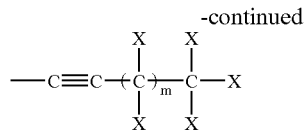

(wherein X contains at least one fluorine atom, and X is independently H, F, $CF_3$, $CHF_2$, $CH_2F$, $OCF_3$, $OCHF_2$ or $OCH_2F$, and m is an integer from 0 to about 18),
k is an integer between 1 and 3, provided that when k is 2 or greater, each $R_1$ may be the same or different, and
l is an integer between 0 and 5, provided that when l is 2 or greater, each $R_2$ may be the same or different.

11. The method according to claim 10, wherein the organic thin film transistor has a top-contact, bottom-contact, or top-gate configuration.

12. The method of claim 10, wherein the organic thin film transistor comprises a gate electrode, the gate insulating layer, the fluorine-based polymer thin film, the organic semiconductor layer and source/drain electrode formed on a substrate.

13. The method according to claim 10, wherein the fluorine-based polymer thin film is formed or deposited by spin coating, dip coating, printing, ink-jet coating, or roll coating.

* * * * *